United States Patent [19]

Takeyama

[11] Patent Number: 5,122,678

[45] Date of Patent: Jun. 16, 1992

[54] IMAGE CLOCK SIGNAL GENERATING SYSTEM WITH INITIAL PHASE MATCHING MEANS IN PHASE-LOCKED LOOP

[75] Inventor: Yoshinobu Takeyama, Kawasaki, Japan

[73] Assignee: Ricoh Company, Ltd., Tokyo, Japan

[21] Appl. No.: 420,878

[22] Filed: Oct. 13, 1989

[30] Foreign Application Priority Data

Oct. 18, 1988 [JP] Japan .................. 63-262135

[51] Int. Cl.$^5$ .................. H03K 5/13; H03K 7/00; H03K 5/153; H03K 7/00
[52] U.S. Cl. .................. 307/269; 307/511; 307/359; 328/63; 328/72; 328/155
[58] Field of Search .................. 307/269, 511, 359; 328/72, 63, 155

[56] References Cited

U.S. PATENT DOCUMENTS

| | | | |
|---|---|---|---|
| 3,781,470 | 12/1973 | Horn | 328/155 |
| 4,975,650 | 12/1990 | Martin | 328/155 |

FOREIGN PATENT DOCUMENTS 60-10967  1/1985  Japan .

OTHER PUBLICATIONS

"Transistor Technology", Analog IC Application Handbook, CQ Publishing K.K., Jan. 1, 1987, pp. 199-200.

*Primary Examiner*—Stanley D. Miller
*Assistant Examiner*—Trong Phan
*Attorney, Agent, or Firm*—Oblon, Spivak, McClelland, Maier & Neustadt

[57] ABSTRACT

An image clock signal generating system generates an image clock signal which is used to enable and disable a scan of an optical scanner, and comprises a phase locked loop (PLL) circuit for generating an image clock signal in response to a reference pulse signal which comprises a plurality of pulses during a time corresponding to a scan range of the optical scanner and no pulses during a time corresponding to a no-scan range of the optical scanner. The PLL circuit includes a phase comparator which receives the reference pulse signal and a feedback signal and outputs a phase error signal dependent on a phase error between the two signals, a voltage controlled oscillator (VCO) for outputting an image clock signal, and an initial phase matching circuit for outputting the feedback signal in response to the image clock signal output from the VCO. The initial phase matching circuit outputs the feedback signal with an initial phase which makes the phase error between the reference pulse signal and the feedback signal approximately the same as a predetermined phase error detected in the phase comparator when the PLL circuit is in a locked state.

6 Claims, 4 Drawing Sheets

IMAGE CLOCK SIGNAL GENERATING SYSTEM WITH INITIAL PHASE MATCHING MEANS IN PHASE-LOCKED LOOP

BACKGROUND OF THE INVENTION

The present invention generally relates to image clock signal generating systems, and more particularly to an image clock signal generating system for an optical scanner.

An optical scanner is used in laser printers, plate making machines, laser facsimile machines, digital copying machines, flying spot scanners and the like. The optical scanner is used to write and/or read information by a light beam.

A laser scanner uses a laser beam to write and/or read information on and/or from a recording medium. Generally, the laser scanner is provided with a deflector such as a polygonal mirror for deflecting a laser beam which is to scan the recording medium. However, it is virtually impossible to keep the scan timing constant for each scan because the rotation of the deflector cannot be maintained perfectly constant and mirror surfaces of the deflector cannot be finished to perfect mirror surfaces. For this reason, a synchronizing signal is required to control the scan timing to an optimum timing.

Conventionally, prior to each scan by the laser beam, the scan is synchronized by detecting the laser beam immediately prior to the scan. The laser beam is detected immediately prior to each scan by a light receiving element which is arranged at a position which is outside an image scan range of the laser beam and leading a start position where the image scan starts. The synchronizing signal is generated based on an output of the light receiving element, and the laser beam is modulated by an image information in synchronism with the synchronizing signal. However, such a synchronization which simply detects the laser beam at one point prior to each scan is insufficient, because the scanning speed is not perfectly constant due to a deviation in the rotational speed of the deflector, a deviation of the characteristic of an fθ-lens from an ideal linear characteristic and the like. When the scanning speed is not perfectly constant, the accuracy of the dot arrangement, that is, the printing quality, deteriorates in the case of the laser printer.

Accordingly, methods have been proposed to generate a reference pulse for synchronization at a plurality of points in each scan. For example, a Japanese Laid-Open Patent Application No. 60-10967 proposes a system of generating an image clock signal by use of a grating which is referred to as a slit, grid or scale. On the other hand, a Japanese Laid-Open Patent Application No. 60-75168 proposes a system of generating an image clock signal by use of a concave mirror array and a plurality of small light receiving elements such as pin photodiodes.

In such proposed systems, the reference pulses (pulse train) which are generated for the entire scan length in accordance with the bright and dark arrangement of the grating are shaped in a shaping circuit if necessary, and a phase locked loop (PLL) circuit generates the image clock signal based on the shaped reference pulses. The image clock signal is used to enable and disable the scanning operation of the optical scanner, that is, to enable and disable the print operation of a laser printer, for example.

FIG. 1 shows an example of a conventional PLL circuit. In FIG. 1, a PLL circuit 1 comprises a voltage controlled oscillator (VCO) 2, a frequency divider 3, a phase comparator 4 and a lowpass filter 5 which are connected as shown. A reference pulse signal (synchronizing signal) Pr which is applied to an input terminal 6 is supplied to the phase comparator 4 which compares the phase of the reference pulse signal Pr with the phase of a feedback signal Pf. This feedback signal Pf is output from the frequency divider 3 which frequency-divides an output image clock signal of the VCO 2 by N (that is, multiplies by 1/N). A phase error signal output from the phase comparator 4 is passed through the lowpass filter 5 which eliminates unwanted noise and high-frequency components. An output signal of the lowpass filter 5 is supplied to the VCO 2. Hence, a feedback control is carried out so as to match the phase of the reference pulse signal Pr and the phase of the feedback signal Pf. The VCO 2 thus outputs the image clock signal which is in phase synchronism with the reference pulse signal Pr and has a frequency N times that of the reference pulse signal Pr. According to this PLL circuit 1, it is possible to obtain an image clock signal which follows a change in the scanning speed, that is, a frequency change of the reference pulse signal Pr.

An information which is to be printed is supplied to a driving and modulating circuit from a printer controller or a host machine. The driving and modulating circuit modulates a laser beam by the information in synchronism with the image clock signal which is output from the PLL circuit 1. As a result, it is possible to print with an accurate dot arrangement. In other words, even when the scanning speed deviates due to an unstable rotation of the polygonal mirror or the like during the printing, the modulation timing of the laser beam is controlled depending on the image clock signal, thereby making it possible to appropriately print optically.

But in FIG. 1, the reference pulse signal Pr which is applied to the PLL circuit 1 is generated intermittently. That is, pulses of the reference pulse signal Pr are generated a plurality of times within the scan range (image range) of the laser beam but ceases in the non-scan range (non-image range) of the laser beam as shown in FIG. 2(A). For this reason, in the non-scan range, an oscillation frequency f0 of the VCO 2 is the free-running frequency of the VCO 2, and it takes a pull-in time tp for the output signal frequency of the VCO 2 (that is, the PLL circuit 1) to stabilize for use as the image clock signal frequency even when the PLL circuit 1 receives the reference pulse signal Pr. FIG. 2(B) shows the output image clock signal ICLK of the VCO 2.

In addition, the feedback signal Pf which is used for the phase comparison with the reference pulse signal Pr in the phase comparator 4 is obtained by frequency-dividing the output signal of the VCO 2 by N in the frequency divider 3. But since the frequency divider 3 operates constantly, the phase error between the feedback signal Pf and the reference pulse signal Pr which is received as the range changes from the non-scan range to the scan range changes because the phase relationship between the output signal of the VCO 2 and the reference pulse signal Pr cannot be guaranteed in the non-scan range. As a result, not only does the pull-in time tp increase, but the stability of the PLL circuit 1 is affected. That is, a phase error DP is introduced between the reference pulse signal Pr shown in FIG. 3(A) and the feedback signal Pf shown in FIG. 3(B).

Therefore, the PLL circuit 1 suffers a problem in that the oscillation frequency f0 of the VCO 2 deviates in the non-scan range in which the reference pulse signal Pr ceases. It is possible to consider holding the input voltage of the VCO 2 in order to stabilize the output of the VCO 2, but the voltage control is easily affected by a temperature change and is unstable.

SUMMARY OF THE INVENTION

Accordingly, it is a general object of the present invention to provide a novel and useful image clock signal generating system in which the problems described above are eliminated.

Another and more specific object of the present invention is to provide an image clock signal generating system for generating an image clock signal which is used to enable and disable a scan of an optical scanner, comprising input terminal means for receiving a reference pulse signal which comprises a plurality of pulses during a time corresponding to a scan range of the optical scanner and no pulses during a time corresponding to a no-scan range of the optical scanner, a PLL circuit coupled to the input terminal means for generating an image clock signal in response to the reference pulse signal received via the input terminal means, and output terminal means coupled to the PLL circuit for outputting the image clock signal. The PLL circuit includes a phase comparator which receives the reference pulse signal and a feedback signal and outputs a phase error signal dependent on a phase error between the reference pulse signal and the feedback signal, a voltage controlled oscillator coupled to an output of the phase comparator for outputting the image clock signal, and an initial phase matching circuit for outputting the feedback signal in response to the image clock signal output from the voltage controlled oscillator. The initial phase matching circuit outputs the feedback signal with an initial phase which makes the phase error between the reference pulse signal and the feedback signal approximately the same as a predetermined phase error detected in the phase comparator when the PLL circuit is in a locked state. According to the image clock signal generating system of the present invention, it is possible to reduce the pull-in time of the PLL circuit and generate an image clock signal which quickly stabilizes. Thus, the image clock signal generated by the present invention can improve the scan accuracy of the optical scanner.

Still another object of the present invention is to provide an image clock signal generating system for generating an image clock signal which is used to enable and disable a scan of an optical scanner, comprising a phase comparator for receiving a reference pulse signal which comprises a plurality of pulses during a time corresponding to a scan range of the optical scanner and no pulses during a time corresponding to a no-scan range of the optical scanner and a feedback signal, where the phase comparator outputs a phase error signal dependent on a phase error between the reference pulse signal and the feedback signal, a lowpass filter supplied with the phase error signal output from the phase comparator, a voltage controlled oscillator supplied with an output signal of the lowpass filter for outputting an image clock signal, where an oscillation frequency of the voltage controlled oscillator is controlled by the output signal of the lowpass filter, and an initial phase matching circuit for outputting the feedback signal in response to the image clock signal output from the voltage controlled oscillator. A PLL circuit is constituted by the phase comparator, the lowpass filter, the voltage controlled oscillator and the initial phase matching circuit. The initial phase matching circuit outputs the feedback signal with an initial phase which makes the phase error between the reference pulse signal and the feedback signal approximately the same as a predetermined phase error detected in the phase comparator when the PLL circuit is in a locked state. According to the image clock signal generating system of the present invention, it is possible to reduce the pull-in time of the PLL circuit and generate an image clock signal which quickly stabilizes.

Other objects and further features of the present invention will be apparent from the following detailed description when read in conjunction with the accompanying drawings.

DESCRIPTION OF THE PREFERRED EMBODIMENTS

Figure 1:
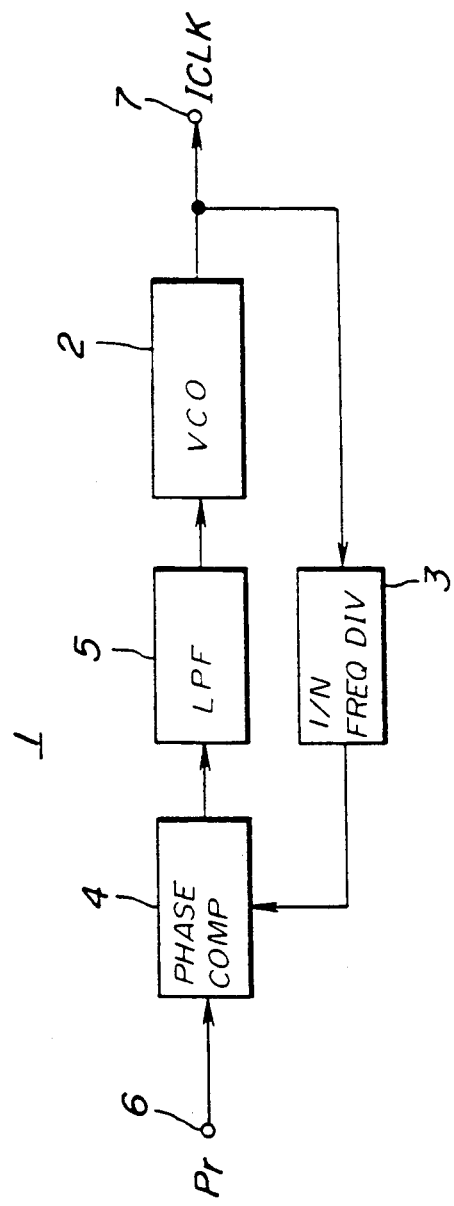
FIG. 1 is a system block diagram showing an example of a conventional PLL circuit.
Figure 2:
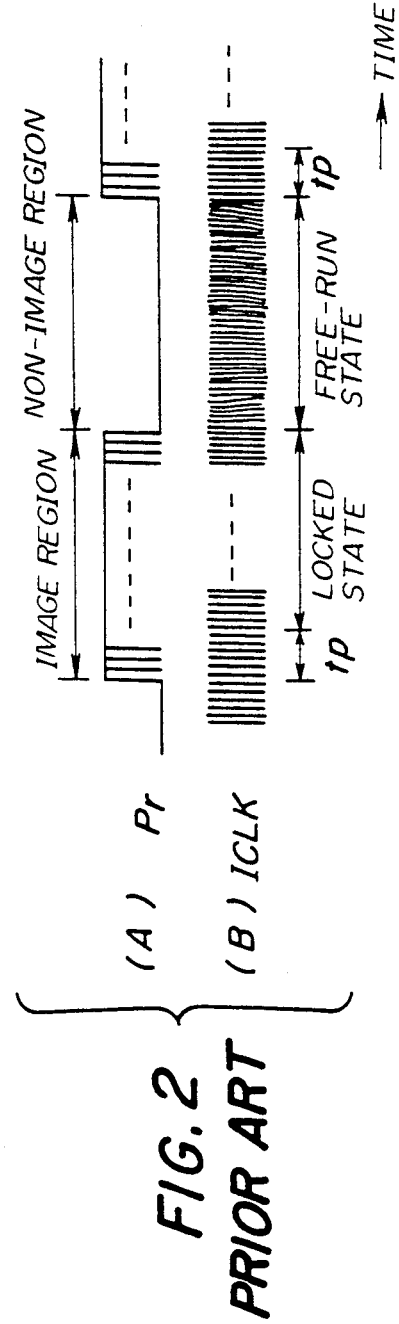
FIGS. 2(A), 2(B), 3(A) and 3(B) are timing charts for explaining an operation of the conventional PLL circuit shown in FIG. 1.
Figure 3:
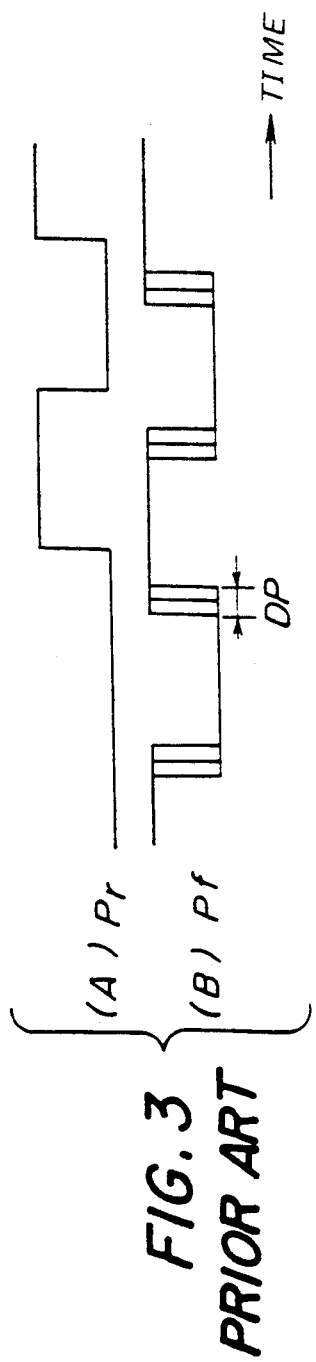
Figure 4:
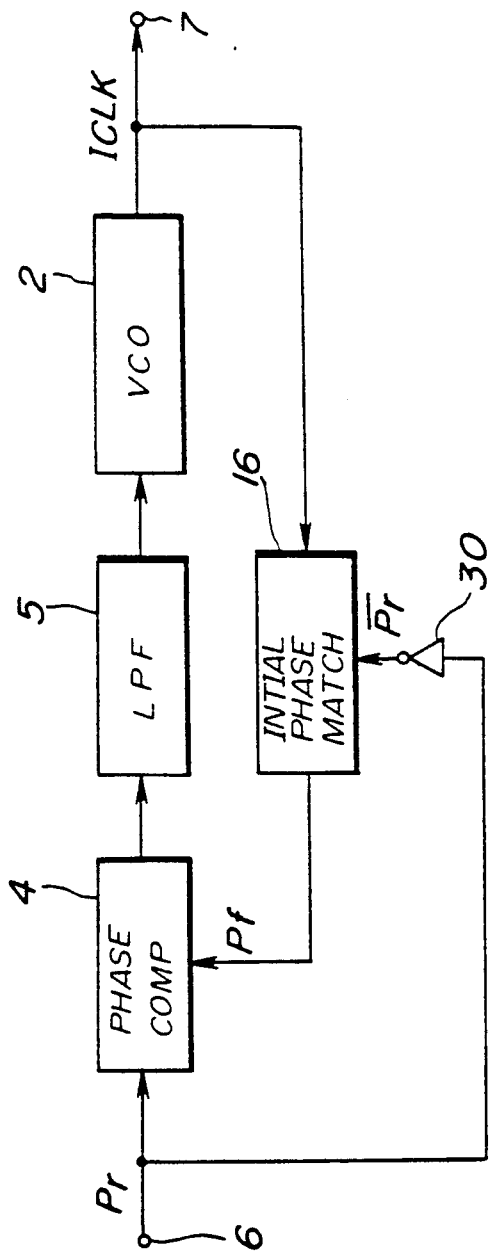
FIG. 4 is a system block diagram showing an essential part of an embodiment of an image clock signal generating system according to the present invention.

FIG. 4 shows an essential part of an embodiment of an image clock signal generating system according to the present invention. In FIG. 4, those parts which are the same as those corresponding parts in FIG. 1 are designated by the same reference numerals, and a description thereof will be omitted. In a PLL circuit 11 shown in FIG. 4, an initial phase matching circuit 16 is provided in place of the frequency divider 3 shown in FIG. 1. The initial phase matching circuit 16 sets an initial phase of the feedback signal Pf which is supplied to the phase comparator 4 for comparison with the reference pulse signal Pr.

In the present specification, a description of the arrangement for generating the reference pulse signal (synchronizing signal) Pr will be omitted. The arrangement for generating the reference pulse signal, the related optical system and the means for utilizing the generated image clock signal are further disclosed in a U.S. Pat. No. 4,837,588 issued Jun. 6, 1989, the disclosure of which is hereby incorporated by reference. In the U.S. Pat. No. 4,837,588, the reference signal Pr is referred to as a synchronizing signal or a synchronizing clock signal.

Figure 5:
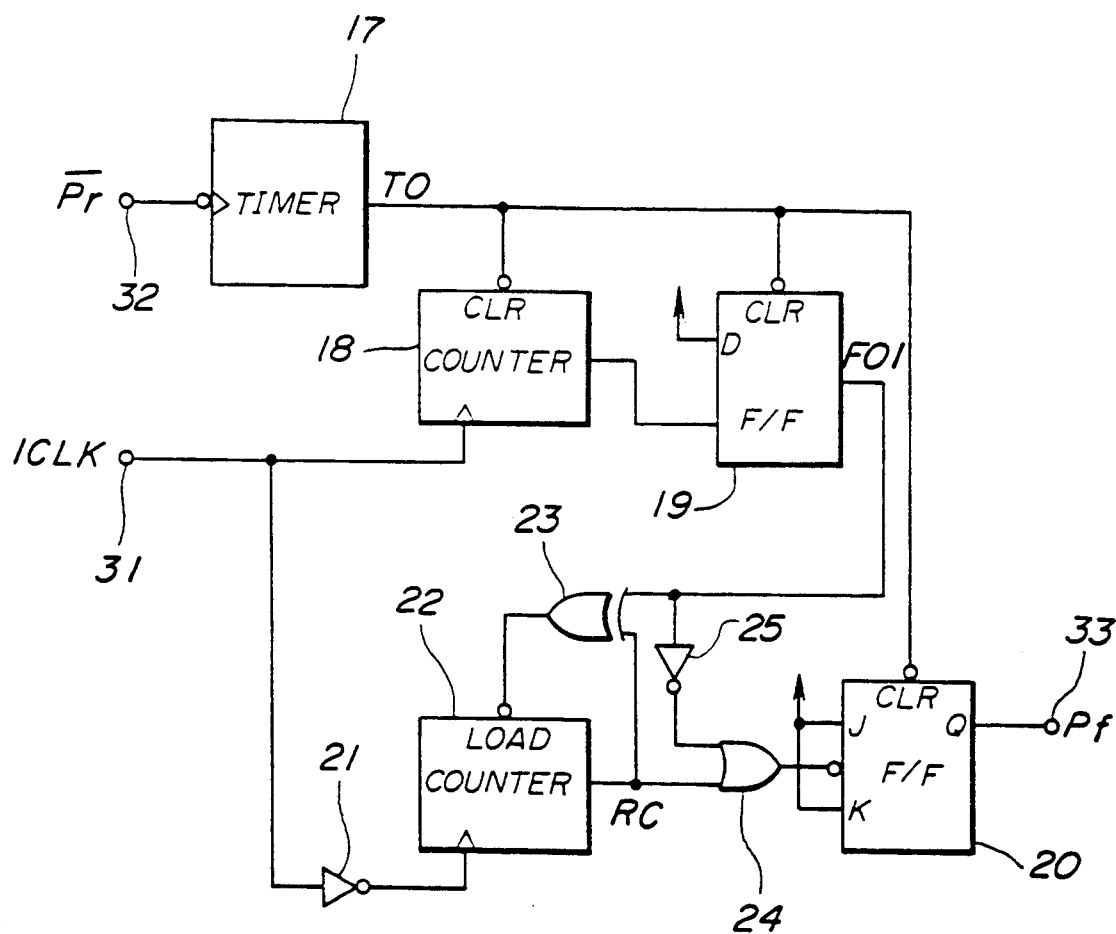
FIG. 5 is a system block diagram showing an embodiment of an initial phase matching circuit shown in FIG. 4.

FIG. 5 shows an embodiment of the initial phase matching circuit 16. The initial phase matching circuit 16 generally comprises a timer 17, first and second counters 18 and 22, first and second flip-flops 19 and 20, inverters 21 and 25, an exclusive-OR circuit 23, and an OR circuit 24 which are connected as shown. The output signal ICLK of the VCO 2 is applied to an input terminal 31, and the reference pulse signal Pr is inverted by an inverter 30 and applied to an input terminal 32.

The feedback signal Pf is output from an output terminal 33.

The timer 17 is set so that an output signal TO of the timer 17 lasts for a time which is longer than the duration of the reference pulse signal Pr. The timer 17 receives via the input terminal 32 the inverted signal $\overline{Pr}$ of the reference pulse signal pr, and the first counter 18 and the first and second flip-flops 19 and 20 are cleared and enabled at a first falling edge of the inverted signal $\overline{Pr}$ in response to the signal TO.

The first counter 18 receives the output signal ICLK of the VCO 2 of the PLL circuit 11 shown in FIG. 4 via the input terminal 31. The first counter 18 counts a number of pulses corresponding to a phase error between the reference pulse signal Pr and the feedback signal Pf in a state where the signals Pr and Pf are locked. On the other hand, the second counter 22 receives the output signal ICLK from the input terminal 31 via the inverter 21. An output signal of the first counter 18 sets the first flip-flop 19, and an output signal FOI of the first flip-flop 19 is applied to a load terminal LOAD of the second counter 22 via the exclusive-OR circuit 23 to enable the second counter 22. When a frequency dividing ratio is denoted by n, this second counter 22 supplies a signal RC to the second flip-flop 20 via the OR gate 24 when n/2 pulses are counted. The output signal FO1 of the first flip-flop 19 is supplied to the other input terminal of the OR gate 24 via the inverter 25. The second flip-flop 20 is a J-K flip-flop and an output value thereof is inverted every time the signal RC is received from the second counter 22. As a result, the second flip-flop 20 generates the feedback signal Pf which is obtained by frequency-dividing the output signal ICLK of the VCO 2 by n (that is, multiplied by 1/n). In this state, the free-running frequency of the VCO 2 is n×Pr, where Pr denotes the frequency of the reference pulse signal Pr.

Figure 6:
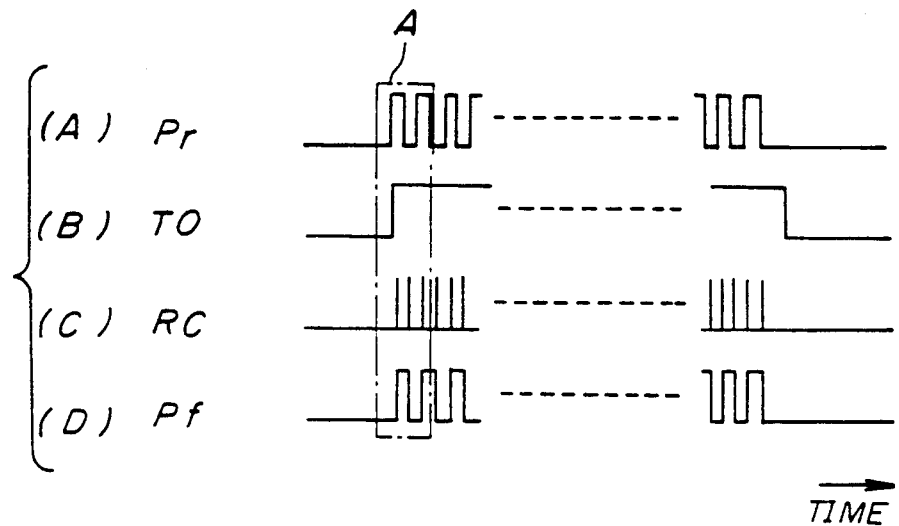
FIGS. 6(A) through 6(D) and 7(A) through (F) are timing charts for explaining the operation of the embodiment shown in FIG. 4.

FIGS. 6(A) through 6(D) are timing charts for explaining the operation of the initial phase matching circuit 16. FIG. 6(A) shows the reference pulse signal Pr, FIG. 6(B) shows the output signal TO of the timer 17, FIG. 6(C) shows the output signal RC of the second counter 22, and FIG. 6(D) shows the feedback signal Pf which is output from the second flip-flop 20.

Figure 7:
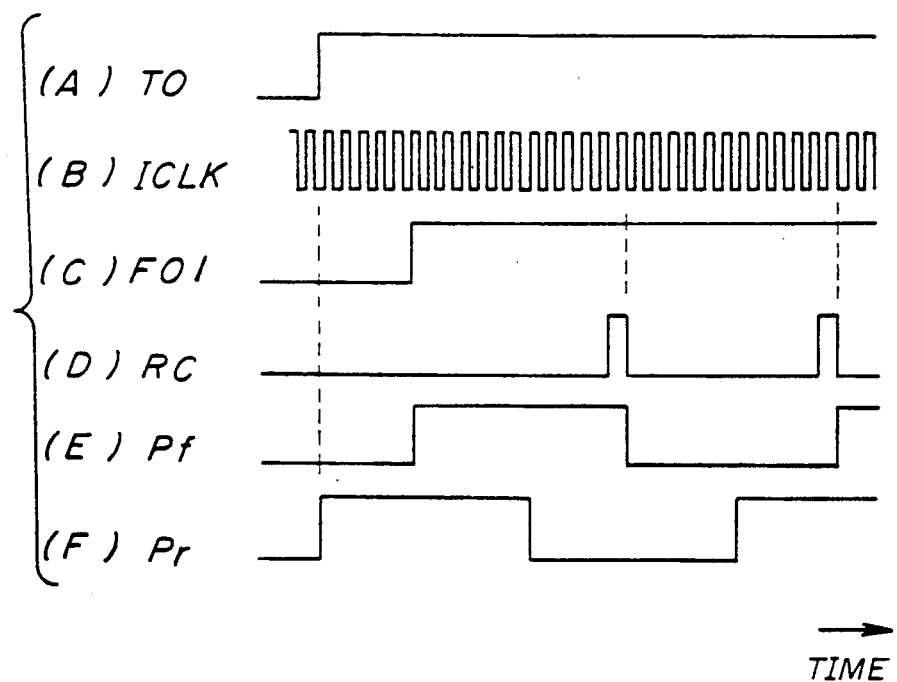

FIGS. 7(A) through 7(F) are timing charts showing signals at various parts of the initial phase matching circuit 16 on an enlarged scale within a time period corresponding to a portion A shown in FIGS. 6(A) through 6(D). FIG. 7(A) shows the output signal TO of the timer 17, FIG. 7(B) shows the output signal ICLK of the VCO 2, FIG. 7(C) shows the output signal FO1 of the first flip-flop 19, FIG. 7(D) shows the output signal RC of the second counter 22, FIG. 7(E) shows the feedback signal Pf which is output from the second flip-flop 20, and FIG. 7(F) shows the reference pulse signal Pr.

According to this embodiment, the phase error of the feedback signal Pf with respect to the reference pulse signal Pr is forcibly set to a phase error of $\pm 2\pi/n$ which exists at the time when the PLL circuit 11 is in a locked state. Because the initial phase of the feedback signal Pf is set so that the phase error of the feedback signal Pf with respect to the reference pulse signal Pr becomes the same as the phase error which exists at the time when the PLL circuit 11 is stable (locked), it is possible to reduce the pull-in time of the PLL circuit 11 and improve the stability of the PLL circuit 11.

In addition, because the phase error is controlled and not the voltage, it is possible to stabilize the operation of the PLL circuit 11 without being affected by a temperature change. Moreover, the circuit construction of the initial phase matching circuit 16 itself is simple.

In the described embodiment, the frequency dividing ratio n is set to twenty-four (24) in FIGS. 7(A) through 7(F). Hence, the phase error between the signals Pr and Pf in the stable (locked) state of the PLL circuit 11 is approximately $\pi/2$, and the counted value of the first counter 18 is six (6).

Further, the present invention is not limited to these embodiments, but various variations and modifications may be made without departing from the scope of the present invention.

What is claimed is:

1. An image clock signal generating system for generating an image clock signal which is used to enable and disable a scan of an optical scanner, said image clock signal generating system comprising:

input terminal means for receiving a reference pulse signal which comprises a plurality of pulses during a time corresponding to a scan range of the optical scanner and no pulses during a time corresponding to a no-scan range of the optical scanner;

a phase locked loop circuit coupled to said input terminal means for generating an image clock signal in response to the reference pulse signal received via said input terminal means; and output terminal means coupled to said phase locked loop circuit for outputting the image clock signal, said phase locked loop circuit including a phase comparator which receives the reference pulse signal and a feedback signal and outputs a phase error signal dependent on a phase error between the reference pulse signal and the feedback signal, a voltage controlled oscillator coupled to an output of said phase comparator for outputting the image clock signal, and an initial phase matching circuit for outputting the feedback signal in response to the image clock signal output from said voltage control oscillator, wherein said initial phase matching circuit comprises first means for outputting a first signal when a number of pulses of the image clock signal corresponding to the predetermined phase error is counted, second means enabled by the first signal for outputting a second signal every time n/2 pulses of the image clock signal are counted, and third means for outputting the feedback signal based on the first and second signals, said initial phase matching circuit outputting the feedback signal with a frequency of 1/n times that of the image clock signal and with an initial phase which makes the phase error between the reference pulse signal and the feedback signal approximately the same as a predetermined phase error detected in said phase comparator when the phase locked loop circuit is in a locked state.

2. The image clock signal generating system as claimed in claim 1 wherein said predetermined phase error is a phase error detected in the phase comparator when the phase locked loop circuit is in a locked state.

3. The image clock signal generating system as claimed in claim 1 wherein said voltage controlled oscillator oscillates at a free-running frequency which n times the frequency of the feedback signal when said initial phase matching circuit outputs the feedback signal with the initial phase.

4. An image clock signal generating system for generating an image clock signal which is used to enable and disable a scan of an optical scanner, said image clock signal generating system comprising:

a phase comparator for receiving a reference pulse signal which comprises a plurality of pulses during a time corresponding to a scan range of the optical scanner and no pulses during a time corresponding to a no-scan range of the optical scanner and a feedback signal, said phase comparator outputting a phase error signal dependent on a phase error between the reference pulse signal and the feedback signal;

a lowpass filter supplied with the phase error signal output from said phase comparator;

a voltage controlled oscillator supplied with an output signal of the lowpass filter for outputting an image clock signal, an oscillation frequency of said voltage controlled oscillator being controlled by the output signal of said lowpass filter; and an initial phase matching circuit for outputting the feedback signal in response to the image clock signal output from said voltage controlled oscillator, a phase locked loop circuit being constituted by said phase comparator, said lowpass filter, said voltage controlled oscillator and said initial phase matching circuit, wherein said initial phase matching circuit comprises a first means for outputting a first signal when a number of pulses of the image clock signal corresponding to the predetermined phase error is counted, second means enabled by the first signal for outputting a second signal every time n/2 pulses of the image clock signal are counted, and third means for outputting the feedback signal based on the first and second signals, said initial phase matching circuit outputting the feedback signal with a frequency 1/n times that of the image clock signal and with an initial phase which makes the phase error between the reference pulse signal and the feedback signal approximately the same as a predetermined phase error detected in said phase comparator when the phase locked loop circuit is in a locked state.

5. The image clock signal generating system as claimed in claim 4 wherein said predetermined phase error is a phase error detected in the phase comparator when the phase locked loop circuit is in a locked state.

6. The image clock signal generating system as claimed in claim 4 wherein said voltage controlled oscillator oscillates at a free-running frequency which n times the frequency of the feedback signal when said initial phase matching circuit outputs the feedback signal with the initial phase.

* * * * *